United States Patent
Tseng (10) Patent No.: US 7,755,694 B2
(45) Date of Patent: Jul. 13, 2010

(54) IMAGE SENSOR PACKAGE AND IMAGE CAPTURE DEVICE WITH SAME

(75) Inventor: Fu-Yen Tseng, Taipei Hsien (TW)

(73) Assignee: Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 334 days.

(21) Appl. No.: 11/868,346

(22) Filed: Oct. 5, 2007

(65) Prior Publication Data

US 2008/0231743 A1 Sep. 25, 2008

(30) Foreign Application Priority Data

Mar. 21, 2007 (CN) .................. 2007 1 0200307

(51) Int. Cl.
*H04N 5/225* (2006.01)
*H04N 3/14* (2006.01)
*H04N 5/335* (2006.01)
*G02B 7/02* (2006.01)

(52) U.S. Cl. .................. 348/340; 348/311; 359/819
(58) Field of Classification Search .................. 348/340, 348/311, 373–375; 359/821, 808–809
See application file for complete search history.

(56) References Cited

U.S. PATENT DOCUMENTS

| | | | | |
|---|---|---|---|---|
| 5,418,566 A | * | 5/1995 | Kameishi | 348/294 |
| 5,508,740 A | | 4/1996 | Miyaguchi et al. | |
| 5,673,083 A | * | 9/1997 | Izumi et al. | 348/340 |
| 6,483,652 B2 | * | 11/2002 | Nakamura | 359/819 |
| 6,518,656 B1 | * | 2/2003 | Nakayama et al. | 257/680 |
| 6,768,516 B2 | * | 7/2004 | Yamada et al. | 348/340 |
| 6,795,120 B2 | * | 9/2004 | Takagi et al. | 348/294 |
| 7,242,433 B2 | * | 7/2007 | Tanaka et al. | 348/340 |
| 7,391,457 B2 | * | 6/2008 | Fujimoto et al. | 348/340 |
| 2001/0055073 A1 | * | 12/2001 | Shinomiya | 348/374 |

* cited by examiner

*Primary Examiner*—Kelly L Jerabek
(74) *Attorney, Agent, or Firm*—Jeffrey T. Knapp (57) ABSTRACT

An image sensor package is provided. The image sensor package includes a basic body, an image sensor chip, a carrier, and at least one passive component. The image sensor chip is electrically and structurally connected to the basic body, the image sensor package including a sensitive region. The carrier positioned on a supporting portion of the image sensor package spacially surrounding the sensitive region of the image sensor chip. The at least one passive component carried by the carrier and electrically connected to the basic body.

8 Claims, 6 Drawing Sheets

IMAGE SENSOR PACKAGE AND IMAGE CAPTURE DEVICE WITH SAME

TECHNICAL FIELD

The present invention generally relates to image sensor packages and, more particularly, to a compact image sensor package and an image capture device with the same.

BACKGROUND

Image sensors are essential components that have been widely used in digital photographic products. Generally, to allow the image sensor to operate, others electronic components associated with the image sensor are often used. For example, a passive component is combined to filter output signals from the image sensor for improving the imaging performance and eliminating the crosstalk noise which occurs during signal switching and transmission.

Figure 6:
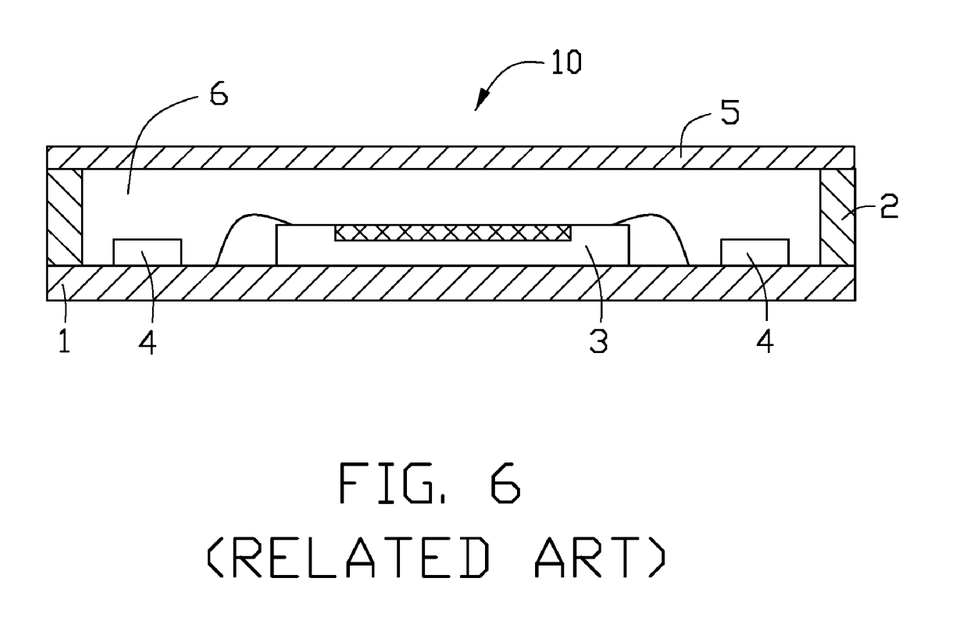
FIG. 6 is a schematic, cross-sectional view of an image sensor package, according to the related art.

Referring to FIG. 6, a typical image sensor package 10 integrated with the passive components includes a substrate 1, a supporter 2, an image sensor chip 3, two passive components 4 and a transparent cover 5. The supporter 2 is mounted on the substrate 1 and defines a cavity 6 together with the substrate 1. Both the image sensor chip 3 and the passive components 4 are disposed within the cavity 6, and both of them are electrically and mechanically connected to the substrate 1. The transparent cover 5 is stably fixed on the supporter 2 for sealing the cavity 6. The image sensor package 10 combines the passive components 4 and the image sensor chip 3 to enhance the quality of the signal transmitting. However, greater surface area on the substrate 1 is required to accommodate both the passive components 4 and the image sensor chip 3 on the same plane. This conflicts with the tendency for miniaturization of the image sensor package and the electronic products with the same.

Therefore, a compact image sensor package and an image capture device with the same are desired.

SUMMARY

In one aspect, an image sensor package is provided. The image sensor package includes a basic body, an image sensor chip, a carrier, and at least one passive component. The image sensor chip electrically and structurally connected to the basic body, the image sensor package includes a sensitive region. The carrier is positioned on a supporting portion of the image sensor package spacially surrounding the sensitive region of the image sensor chip. The at least one passive component carried by the carrier and electrically connected to the basic body.

Those and other advantages and novel features will be more readily apparent from the following detailed description set forth below taken in conjunction with the accompanying drawings.

DETAILED DESCRIPTION OF THE PREFERRED EMBODIMENTS

Figure 1:
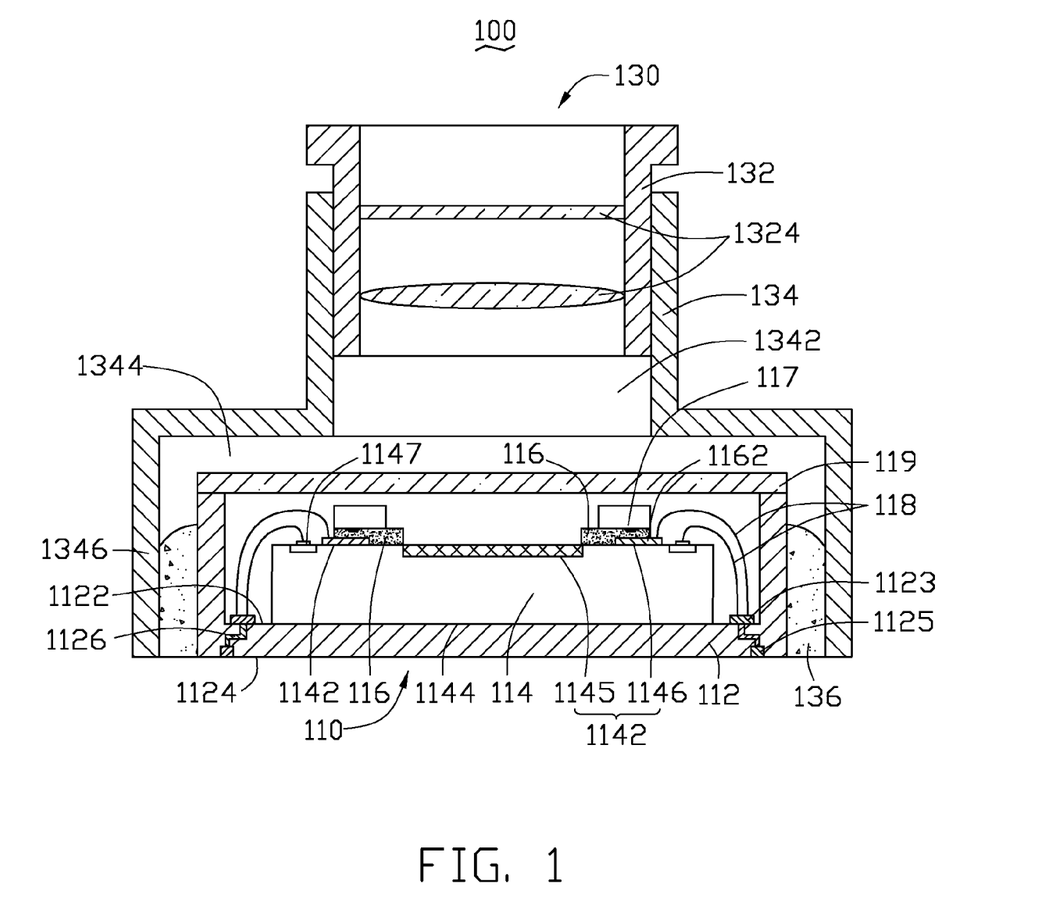
FIG. 1 is a schematic, cross-sectional view of an image capture device, according to a first preferred embodiment.

As illustrated in FIG. 1, an image capture device 100, according to a first preferred embodiment, includes an image sensor package 110 and a lens module 130. The image sensor package 110 is accurately aligned with the lens module 130 and assembled with it.

The image sensor package 110 includes a body 112, an image sensor chip 114, a carrier 116, two passive components 117, a plurality of wires 118 and a cover 119.

The body 112, may be formed of ceramic or laminate, but not limited to ceramic and laminate. The body 112 is configured for supporting the image sensor chip 114. The basic body 112 includes an interior, e.g., upper surface 1122 and an opposite exterior e.g., lower surface 1124. A number of input terminals 1123 and corresponding output terminals 1125 are respectively formed on the upper surface 1122 and the lower surface 1124 of the basic body 112. The input terminals 1123 are electrically coupled to the output terminals 1125 respectively by an inner circuit 1126 in the body 112.

The image sensor chip 114 is a photosensitive element responsive to infrared radiation, ultraviolet radiation, and visible light beams and used to transform light signals into electronic signals. The image sensor chip 114 includes an upper surface 1142 and a lower surface 1144 on opposite sides of the image sensor chip 114. The upper surface 1142 of the image sensor chip 114 includes a sensitive region 1145 and a non-sensitive region 1146 surrounding the sensitive region 1145. A number of bonding pads 1147 are separately formed on the non-sensitive region 1146 of the image sensor chip 114. The image sensor chip 114 is mounted on the upper surface 1122 of the basic body 112 via the lower surface 1144 thereof.

The carrier 116 is positioned on the non-sensitive region 1146 of the upper surface 1142 of the image sensor chip 114. The carrier 116 is a thin adhesive layer for providing structural connection for two or more members to be connected. The carrier 116 is also capable of providing electrical connection for those members to be connected. The carrier 116 is made from a resin adhesive. In addition, it is possible to mix some conductive particles in the resin adhesive to form an anisotropic conductive film that can conduct electrical current in a desired direction. The carrier 116 may combine some electrodes 1162 to connect to other conductive element such as wires to create relatively remote electrically connections. The resin adhesive in the carrier 116 is configured for resisting moisture and heat, insulating and fixing the relative location in which the electrodes 1162 of the carrier 116 and those members to be connected are. In addition, the carrier 116 provides a holding force to maintain effectively connections between the electrodes 1162 and the conductive particles within the carrier 116. The conductive particles are configured for electrically connecting the members to be connected and the electrodes 1162 of the carrier 116. In this embodiment, the non-sensitive region 1146 of the image sensor package 110 acts as a supporting portion for supporting the carrier 116. It is understandable that the supporting portion is at least partly overlapped with the non-sensitive region in a direction perpendicular to the image sensor chip 114.

The passive components 117 such as inductor, capacitor or resistor, etc. are generally used for improving the transmission quality of image signals outputted from the image sensor 114. The passive components 117 having a number of electrodes formed therein are disposed on the carrier 116, and are electrically connected to the electrodes 1162 of carrier 116 via the conductive particle contained in the carrier 116.

Both the image sensor chip 114 and the passive components 117 are electrically connected to the body 112 via the wires 118 respectively. One end of each wire 118 is electrically coupled to the bonding pads 1147 of the image sensor chip 114 or the electrode 1162 of the carrier 116, and the other end of each wire 118 is coupled to the input terminal 1123 of the body 112.

The cover 119 is made of transparent material. The cover 119 is mounted on the body 112 for cooperating with the body 112 to seal the image sensor chip 114 and keeping the image sensor chip 114 free from the external environment and enhancing the reliability of the image sensor chip 114.

The lens module 130 comprises a lens barrel 132, a lens holder 134 and adhesive material 136. The lens barrier 132 is a hollow cylinder with at least one lens 1324 received therein for providing a path for the incident light. One end of the lens barrel 132 is received in the lens holder 134. The lens holder 134 is a stepped hollow cylinder, which includes a first receiving potion 1342 and a second receiving potion 1344 directly extending from the first receiving potion 1342. The first receiving potion 1342 of the lens holder 134 has a diameter smaller than the diameter of the second receiving potion 1344. The second receiving potion 1344 of the lens holder 134 has a side wall 1346 via which the lens holder 134 is attached to the circumferential wall of the image sensor package 110 by the adhesive material 136, whereby the image sensor package 110 is hermetically received within the second receiving potion 1344 of the lens holder 134. It is understandable that the diameter of the first receiving potion 1342 and the second receiving potion 1344 of the lens holder 134 can vary according to the actual need, for example, the former can be larger than the latter or equal with each other. In addition, the lens module 130 can also be positioned on the top of the image sensor package 100 by fixing the lens holder 134 of the lens module 130 on the image sensor package 110.

Figure 2:
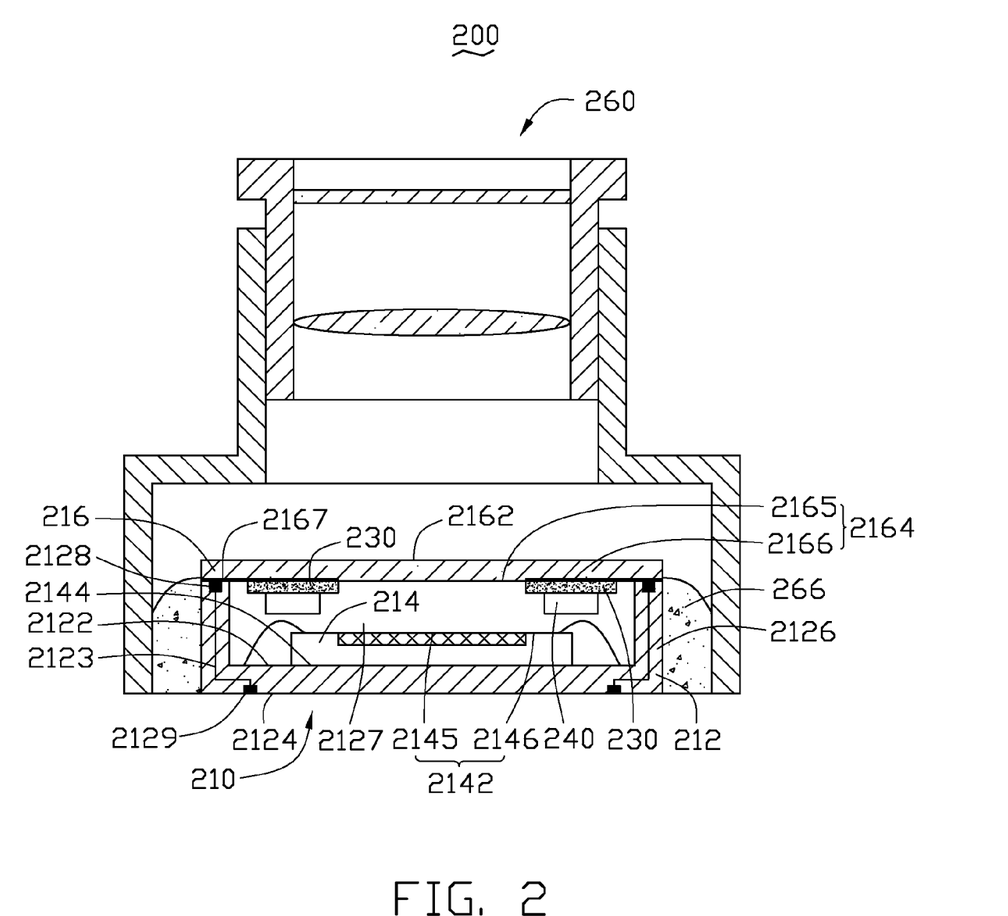
FIG. 2 is a schematic, cross-sectional view of an image capture device, according to a second preferred embodiment.

As illustrated in FIG. 2, an image capture device 200, according to a second preferred embodiment, is similar to the image capture device 100. The image capture device 200 includes an image sensor package 210, a carrier 230, a number of passive components 240 and a lens module 260.

The image sensor package 210 includes a body 212, an image sensor chip 214 and a cover 216.

The body 212 has a U-shaped cross-section and includes a bottom wall with a first surface 2122 and an opposite second surface 2124. A frame 2126 extends upward from the first surface 2122 of the body 212 and together with the bottom wall defines a cavity 2127. The image sensor chip 214 is disposed in the cavity 2127.

The image sensor chip 214 is a photosensitive element used for responding to infrared radiation, ultraviolet radiation, and visible light and transforming it to electronic signals. The image sensor chip 214 includes an upper surface 2142 and a lower surface 2144 at opposite sides of the image sensor chip 214. The upper surface 2142 of the image sensor chip 214 has a sensitive region 2145 and a non-sensitive region 2146 surrounding the sensitive region 2145. The image sensor chip 214 is mounted on the first surface 2122 of the body 212 via the lower surface 2144 thereof, and electrically connected with it.

The cover 216 includes a front surface 2162 and a rear surface 2164. The periphery of the rear surface 2164 of the cover 216 is attached on the frame 2126 of the basic body 212 to enclose the cavity 2127 for keeping the image sensor chip 214 free from pollution/contamination and to enhance the reliability of the image sensor chip 214.

The lens module 260 receives the image sensor package 210 therein and connects with that via the adhesive material 266.

The main difference between the image capture device 200 and the image capture device 100 will be described as follows:

A number of conductive fingers 2128 are installed on a top surface of the frame 2126 of the image sensor package 210, and electrically connected to output terminals 2129 of the body 212 respectively via the inner circuit 2123 of the body 212.

The rear surface 2164 of the cover 216 includes a non-electrode area 2165 and an electrode area 2166 surrounding the non-electrode area 2165. A number of electrodes 2167 are formed on the electrode area 2166. One end of each electrode 2167 is held on the top surface of the frame 2126 by the cover 216 so that each electrode 2167 can electrically connect to the conductive finger 2128 on the frame 2126. The non-electrode area 2165 of the cover 216 is correctly aligned with the sensitive region 2145 of the image sensor chip 214, and the area of the non-electrode area 2165 should be equal to/larger than that of the sensitive region 2145 of the image sensor chip 214.

The carrier 230 is a thin connecting layer such as, for example, anisotropic conductive film or anisotropic conductive ointment, etc. for providing an electrical structural connection for two or more elements which need to be connected together. The carrier 230 is mounted on the electrode area 2166 of the cover 216.

The passive components 240 are mounted on the electrode area 2166 of the cover 216 and electrically connected with the electrode area 2166 via the carrier 230.

In this preferable embodiment, the passive components 240 are positioned in the space between the cover 216 and the non-sensitive region 2146 of the image sensor chip 214, therefore, the space, in directions parallel to the image sensor chip 214, of the image sensor package 210 is efficiently used and the objective of minimizing the image sensor package 210 and the image capture device 200 can be achieved.

Figure 3:
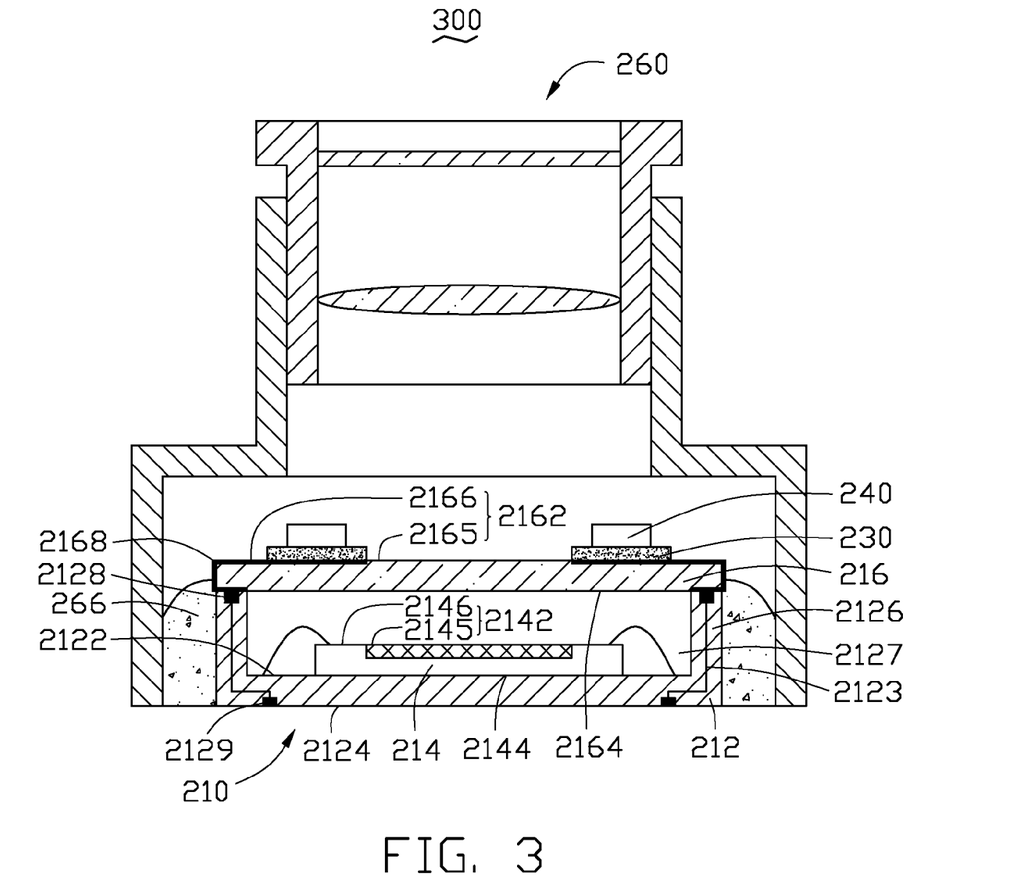
FIG. 3 is a schematic, cross-sectional view of an image capture device, according to a third preferred embodiment.

As illustrated in FIG. 3, an image capture device 300, according to a third preferred embodiment, is similar to the image capture device 200. The main difference between the image capture device 300 and the image capture device 200 is as described below.

Each electrode 2168 is installed on the electrode-area 2166' located on the front surface 2162 of the cover 216, and extending to an edge of the rear surface 2164 of the cover 216 to couple to the conductive finger 2128 formed on the top surface of the frame 2126.

The carrier 230 is disposed on the electrode area 2166 of the front surface 2162 of the cover 216. The carrier 230 can electrically connect to those electrodes 2167 installed on the front surface 2162 of the cover 216.

The passive components 240 are mounted on the carrier 230 and electrically connected to the electrode area 2166 of the cover 216 via the carrier 230.

In this preferable embodiment, the passive components 240 are positioned on the electrode area 2166 of the cover 216 which is arranged above the non-sensitive area 2146 of the image sensor chip 214, therefore the space in the image capture device 300 is effectively used and the objects of minimized the image sensor package 210 and the image capture device 300 have been achieved.

Figure 4:
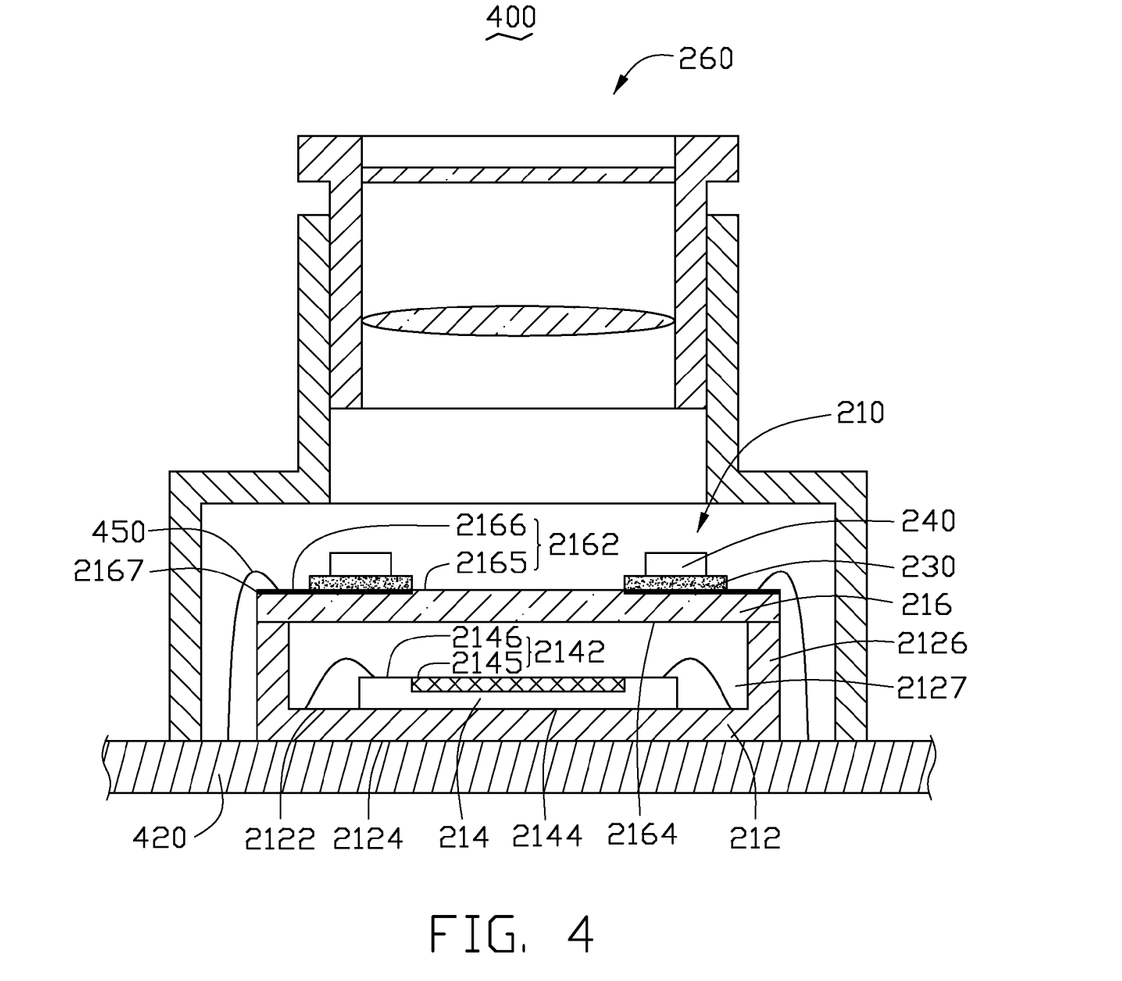
FIG. 4 is a schematic, cross-sectional view of an image capture device, according to a fourth preferred embodiment.

As illustrated in FIG. 4, an image capture device 400, according to a fourth preferred embodiment, is similar to the image capture device 300. The main difference between the image capture device 400 and the image capture device 300 is described as below.

The image capture device 400 includes a circuit board 420 and a plurality of wires 450. The circuit board 420 has a pattern trace (not labeled) formed thereon for providing electrical transmission between two or more electronic elements mounted thereon. The image sensor package 210 is structurally and electrically connected on the circuit board 420 via the second surface 2124 of board 212. The lens module 260 is mounted on the circuit board 420 by a free end of the holder 264 which is not coupled to the lens barrel 262. The image sensor package 210 is hermetically received in the space formed by the holder 264 and the circuit board 420.

One end of the each wire 450 is electrically coupled to the electrode 2167 installed on the front surface 2162 of the cover 216, the other end of the wire 450 is electrically coupled to the pattern trace of the circuit board 420, through which the passive components 240 are electrically connected to the circuit board 420.

In this preferable embodiment, the passive components 240 is positioned on the electrode area 2166 of the cover 216 via the carrier 230 and electrically connected to the circuit board 420 via the wire 450. Therefore the image capture device 400 not only reduces the whole size of the image capture device 400, but also simplifies the manufacturing process of the image capture device 400 via wire 450 to electrically connect the passive components 240 to the circuit board 420.

Figure 5:
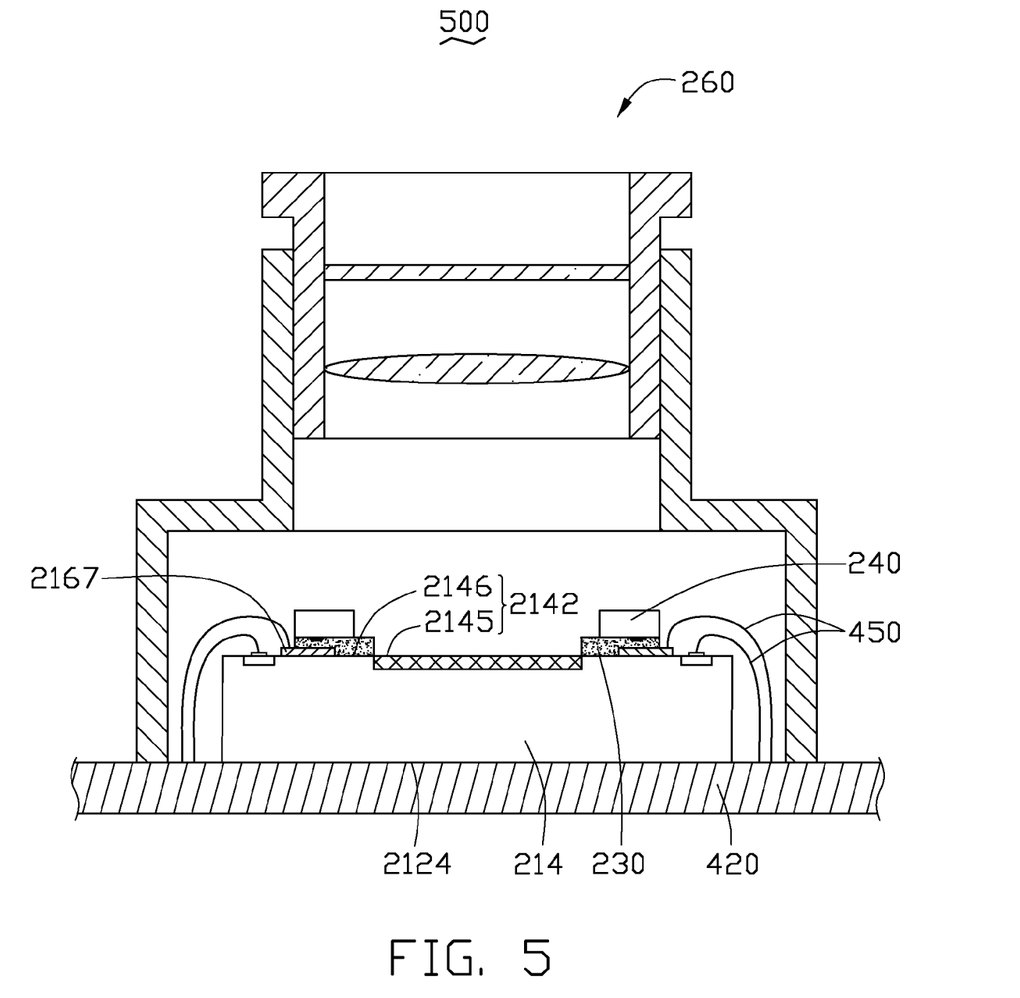
FIG. 5 is a schematic, cross-sectional view of an image capture device, according to a fifth preferred embodiment.

As illustrated in FIG. 5, an image capture device 500, according to a fifth preferred embodiment, is similar to the image capture device 400. The main difference between the image capture device 500 and the image capture device 400 is described as below.

The image sensor chip 214 is directly mounted on the circuit board 420 and electrically connected to the circuit board 420 via the wires 450.

The passive components 240 is mounted on the non-sensitive region 2146 of the image sensor chip 214 via the carrier 230 and electrically connected to the circuit board 420 via the wires 450.

The carrier 230 may include a number of electrodes 2167. The passive components 240 are electrically connected to the carrier 230 that is electrically connected to the circuit board 420 via the electrodes 2167 bonded with the wires 250.

In the fifth preferable embodiment above mentioned, the image sensor chip 214 is directly mounted on the circuit board 420, in which some elements such as the body 212 can be omitted. In this way the size of the image capture device 500 is further reduced, while the structure of the image capture device 500 is simplified which can reduce the cost and increase production of the image capture device 500.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An image sensor package comprising:
a body;
an image sensor chip electrically and structurally connected to the body, the image sensor chip including a sensitive region and a non-sensitive region surrounding the sensitive region;
a supporting portion disposed on the body and specially surrounding the sensitive region of the image sensor chip, the supporting portion at least partly overlapping with the non-sensitive region in a direction perpendicular to the image sensor chip;
a carrier positioned on the supporting portion; and
at least one passive component carried by the carrier and electrically connected to the body;
a cover disposed on the image sensor chip, wherein the cover comprises a non-electrode region aligned with the sensitive region of the image sensor chip and an electrode region surrounding the non-electrode region and acting as the supporting portion, the carrier being positioned on the electrode region of the cover; and
a frame formed on the body, a plurality of conductive fingers being attached on a top surface of the frame away from the body and electrically connected to conductive points disposed at a bottom surface of the body, a plurality of electrodes being installed on the electrode region of the cover and being electrically coupled to the conductive fingers.

2. The image sensor package as claimed in claim 1, wherein the carrier is an adhesive resin.

3. The image sensor package as claimed in claim 2, wherein the carrier further includes some conductive particles mixed within the adhesive resin.

4. The image sensor package as claimed in claim 3, wherein the carrier further includes a plurality of conductive electrodes partially embedded therein, and configured for electrically connecting the carrier to the body.

5. The image sensor package as claimed in claim 1, wherein the cover is mounted on the top surface of the frame, and the passive components are electrically connected to the electrodes of the carrier.

6. The image sensor package as claimed in claim 1, wherein the cover comprises a first surface and an opposite second surface, the cover being mounted on the top surface of the frame via the edge of the second surface, the electrode region being formed on the second surface of the cover.

7. An image capture device comprising:
a lens module with at least one lens; and
an image sensor package attached to one end of the lens module away from the at least one lens, the package comprising:
a body;
an image sensor chip electrically and structurally connected to the body, the image sensor chip including a sensitive region aligned with the at least one lens and a non-sensitive region surrounding the sensitive region;
a supporting portion disposed on the body and specially surrounding the sensitive region of the image sensor chip;
a carrier positioned on the supporting portion and at least partly overlapping with the non-sensitive region of the image sensor chip in the axis of the lens; and
at least one passive component carried by the carrier and electrically connected to the body;
a cover disposed on the image sensor chip, wherein the cover comprises a non-electrode region aligned with the sensitive region of the image sensor chip and an electrode region surrounding the non-electrode region and acting as the supporting portion, the carrier being positioned on the electrode region of the cover; and a frame formed on the body, a plurality of conductive fingers being attached on a top surface of the frame away from the body and electrically connected to conductive points disposed at a bottom surface of the body, a plurality of electrodes being installed on the electrode region of the cover and being electrically coupled to the conductive fingers.

8. The image capture device as claimed in claim 7, wherein the lens module further comprises a lens holder and a lens barrel in which the at least one lens is received; the lens holder including two receiving portion, the lens barrel being received in one receiving portion, and the image sensor package being received in the other receiving portion.

* * * * *